CIRCUITS FOR DELAYING ELECTRIC SIGNALS
WITH CONTROLLED CLAMP INITIATING DELAY

Filed Jan. 6, 1964

INVENTORS.
ALAN McDOWELL and
ROBERT W. MOWERY
By Donald G. Dalton
Attorney

United States Patent Office 3,299,288

Patented Jan. 17, 1967

3,299,288

CIRCUITS FOR DELAYING ELECTRIC SIGNALS WITH CONTROLLED CLAMPS INITIATING DELAY

Alan McDowell and Robert W. Mowery, Columbus, Ohio, assignors, by mesne assignments, to United States Steel Corporation, a corporation of Delaware Filed Jan. 6, 1964, Ser. No. 335,981
1 Claim. (Cl. 307—88.5)

Figure 1:
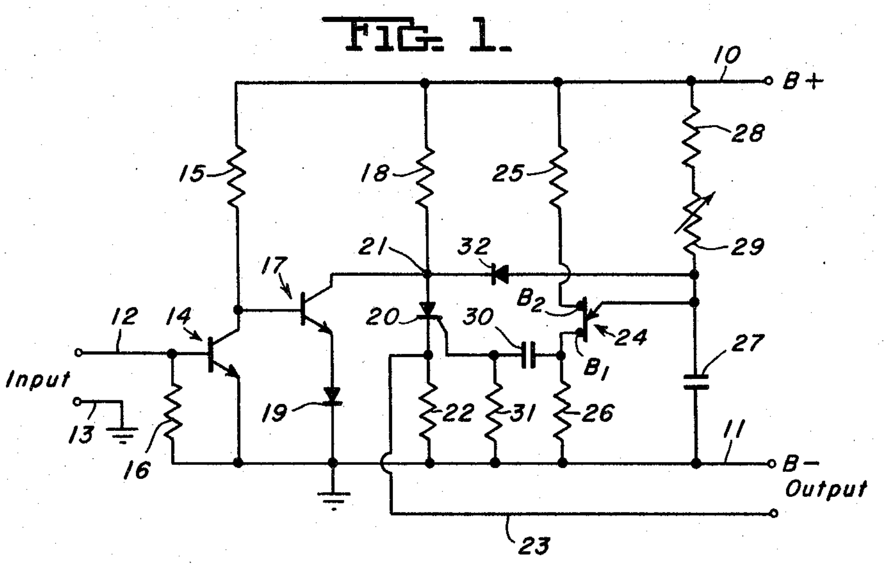

This invention relates to improved circuits for delaying an electric signal, such as a change in voltage level or a pulse.

An object of the invention is to provide a simplified transistor circuit for converting an input signal into a delayed output signal which can be used to control some other operation at the proper time.

A further object is to provide a circuit which produces output signals after a constant but adjustable delay following receipt of an input signal.

Figure 2:
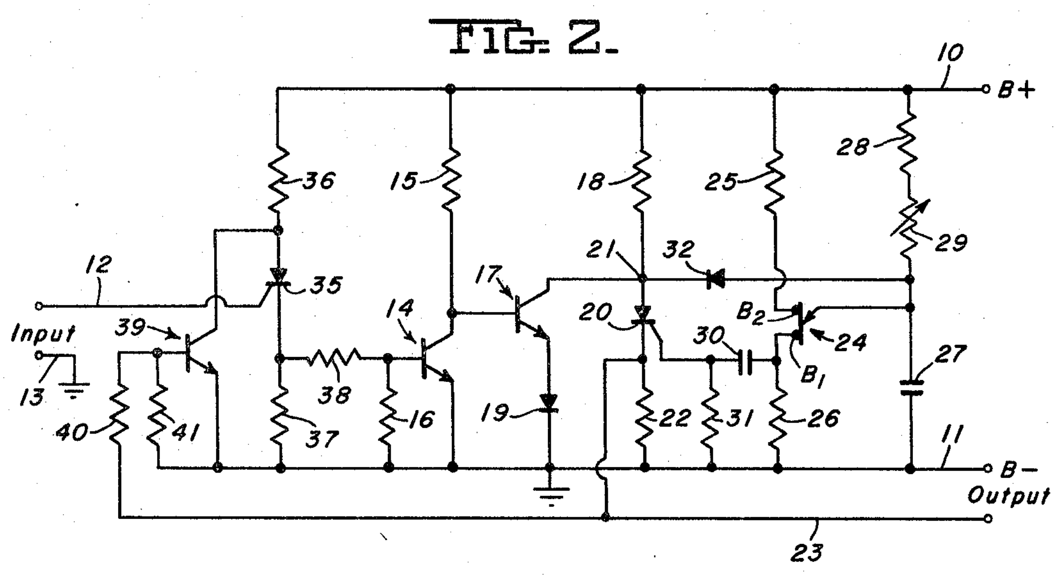

In the drawing:

FIGURE 1 is a schematic wiring diagram of our circuit arranged to delay a voltage level signal; and FIGURE 2 is a schematic wiring diagram of our circuit modified to delay a pulse.

FIGURE 1 shows conductors 10 and 11, which we connect to the positive and negative sides B+ and B— of a D.-C. voltage source (for example 10 volts), and input conductors 12 and 13, which we connect to a source of signals. In this instance the signal is a positive-going change in voltage level. We illustrate the negative conductors 11 and 13 as grounded, although this is optional. We connect the collector of an NPN transistor 14 to the positive conductor 10 via a relatively large resistor 15 (for example 10K ohms), and connect the emitter of this transistor to the negative conductor 11. We connect the base of the transistor to the signal input conductor 12, and connect a bias resistor 16 (for example 2K ohms) across conductors 12 and 11 in parallel with the base circuit of the transistor. We connect the collector of another NPN transistor 17 to the positive conductor 10 via a relatively small resistor 18 (for example 360 ohms), and we connect the emitter of this transistor to the negative conductor 11 via a bias diode 19. We connect the base of transistor 17 between the collector of transistor 14 and resistor 15.

We connect the anode of a controlled rectifier 20 to a junction point 21 located between the collector of transistor 17 and resistor 18. We connect the cathode of the controlled rectifier to the negative conductor 11 via a relatively small resistor 22 (for example 51 ohms). We connect a signal output conductor 23 between the controlled rectifier and resistor 22. We connect one base $B_2$ of a unijunction transistor 24 to the positive conductor 10 via a relatively small resistor 25 (for example 470 ohms). We connect the other base $B_1$ to the negative conductor 11 via a relatively small resistor 26 (for example 33 ohms). We connect a capacitor 27 across conductors 10 and 11 in series with relatively large resistors 28 and 29 (for example 33K ohms and 150K ohms respectively), and connect the emitter of the unijunction transistor 24 between capacitor 27 and resistor 29. Preferably resistor 29 is adjustable. We connect the gate of the controlled rectifier 20 to the base $B_1$ of transistor 24 via a capacitor 30, and also connect this base to conductor 11 via an intermediate size resistor 31 (for example 1K ohms). We also connect the junction point 21 to the emitter of the unijunction transistor 24 via a blocking diode 32.

An NPN transistor allows current to flow from its collector to its emitter when a voltage which is positive with respect to its emitter is applied to its base; otherwise it is practically nonconductive. A controlled rectifier normally is nonconductive, but allows current to flow from its anode to its cathode when a positive pulse reaches its gate. It remains conductive until voltage is removed from its anode, even though the pulse ceases. A unijunction transistor offers relatively high resistance to flow of current between its emitter and base $B_1$ as long as the voltage on its emitter does not exceed the "firing voltage." When the transistor is operated with a positive voltage applied to its base $B_2$ with respect to its base $B_1$, the "firing voltage" is defined as the maximum positive voltage which can be applied to its emitter with respect to base $B_1$ before the resistance between the emitter and base $B_1$ suddenly becomes quite low. For a more detailed explanation of the operation of a unijunction transistor, reference can be made to a printed publication, General Electric Transistor Manual, 6th edition, copyright 1962 (chapter 13).

As long as our circuit is in its state of rest, the NPN transistor 14 is nonconductive or turned off, since there is no signal on its base. Resistor 16 references the base with respect to the emitter. A positive voltage is applied to the base of the other NPN transistor 17 from the conductor 10 via resistor 15. Thus transistor 17 is turned on; current flows from the positive conductor 10 through resistor 18, transistor 17 and diode 19 to the negative conductor 11. The voltages at the anode of our controlled rectifier 20, at the emitter of our unijunction transistor 24, and at capacitor 27 are clamped substantially at ground, except for small voltage drops across transistor 17 and diode 19 (and also across diode 32 for the emitter and capacitor). Base $B_2$ of the unijunction transistor 24 receives a positive voltage via resistor 25. Hence negligible current flows through the transistor; capacitors 27 and 30 do not charge; the gate of the controlled rectifier 20 receives no pulse; and the controlled rectifier is nonconductive.

When a positive D.-C. signal sufficient to saturate transistor 14 is applied to the input conductors 12 and 13, current flows from the positive conductor 10 through resistor 15 and transistor 14 to the negative conductor 11. The voltage at the base of transistor 17 becomes virtually that of conductor 11, whereupon transistor 17 is turned off and the potential at its collector and at the anode of the controlled rectifier 20 rises to the B+ voltage. Diode 32 blocks this potential from reaching capacitor 27, but the clamp is removed and capacitor 27 commences to charge through resistors 28 and 29. After a delay, the length of which depends on the magnitudes of resistors 28 and 29 and capacitor 27, the capacitor becomes charged sufficiently that the voltage on the emitter of the unijunction transistor 24 reaches the firing voltage. The unijunction transistor "avalanches," whereupon the charge on capacitor 27 quickly flows through the emitter of transistor 24 and resistor 26 to the negative conductor 11, causing a positive pulse to appear across resistor 26. Capacitor 30 transmits this pulse to the gate of the controlled rectifier 20. Since the anode of this rectifier already is at B+ voltage, current commences to flow through the rectifier and resistor 22 to conductor 11. An output signal appears across conductors 11 and 23. As soon as the input signal on conductors 12 and 13 ceases, transistor 14 returns to its nonconductive state; transistor 17 again conducts; the anode voltage on the controlled rectifier 20 is removed; the rectifier ceases to conduct; and the output signal terminates. The circuit resumes its state of rest, already described.

FIGURE 2 shows a modification of our circuit which requires an input pulse of only a few microseconds duration to initiate a timing action. After a predetermined interval, a pulse appears at the output conductors, but it likewise is of very short duration. The modification includes all the components included in FIGURE 1. We have identified these components by the same reference characters in FIGURE 2 and have not repeated the description.

The modified circuit includes another controlled rectifier 35, the anode of which we connect to the positive conductor 10 via a resistor 36 and the cathode of which we connect to the negative conductor 11 via a resistor 37. We connect the positive input conductor 12 to the gate of the controlled rectifier, and connect the cathode to the base of transistor 14 via a resistor 38. We connect the collector of another NPN transistor 39 between resistor 36 and the controlled rectifier 35 and connect the emitter to the negative conductor 11. We connect the base of transistor 39 to the positive output conductor 23 and to the negative conductor 11 via resistors 40 and 41 respectively.

As long as the circuit is in its state of rest, the anode of the controlled rectifier 35 is at B+ potential, but the rectifier does not conduct since no positive pulse has been applied to its gate. Transistor 39 does not conduct, since no current reaches its base. When a positive-going pulse is applied to the input conductor 12, the controlled rectifier 35 becomes conductive. Current flows from the positive conductor 10 through resistor 36, rectifier 35 and resistor 37 to the negative conductor 11. Sufficient current also flows through resistor 38 to the base of transistor 14 to cause it to conduct, whereupon the action already described takes place to produce a delayed output pulse across conductors 11 and 23. This pulse also feeds back through resistor 40 to the base of transistor 39, and the transistor momentarily becomes conductive. Current flows momentarily through the transistor, removing the positive potential from the anode of the controlled rectifier and terminating flow of current therethrough. Thus the circuit returns to its state of rest after a very brief pulse appears across the output conductors 11 and 23.

From the foregoing description it is seen that our invention affords simple transistor circuits for delaying electric signals for predetermined intervals. The signal may be either a change in voltage level which persists for an appreciable interval or a momentary pulse. The delay is determined by the time required for capacitor 27 to charge, and this time is easily adjusted by changing the magnitude of the adjustable resistor 29. It is to be understood that the values we have stated for the various resistors and voltages are only for purposes of example and can vary widely.

While we have shown and described certain preferred embodiments of the invention, it is apparent that other modifications may arise. Therefore, we do not wish to be limited to the disclosure set forth but only by the scope of the appended claim.

We claim:

A circuit for delaying electric signals comprising:

positive and negative conductors adapted to be connected to opposite sides of a D.C. voltage source;

first and second controlled rectifiers having respective anodes connected to said positive conductors, respective cathodes connected to said negative conductors, and respective gates;

both said rectifiers being normally non-conductive but becoming conductive when pulses are applied to their respective gates;

a capacitor connected across said conductors;

means normally clamping said capacitor and the anode of said first rectifier to near ground potential and including:

- a first transistor connected across said conductors and being normally turned off; and
- a second transistor connected across said conductors and being normally turned on;

means connected to the gate of said second rectifier for applying input signals thereto in the form of momentary pulses to render this rectifier conductive;

said second rectifier being connected to the base of said first transistor to turn on this transistor when the second rectifier becomes conductive;

said first transistor being connected to the base of said second transistor to turn off the second transistor when the first is turned on;

said second transistor being connected to said capacitor and to the anode of said first rectifier to remove the clamp when the second transistor is turned off and enable the capacitor and anode to receive the potential of said positive conductor, thus allowing said capacitor to charge;

means connecting said capacitor and the gate of said first rectifier for transmitting a pulse to this gate and rendering this rectifier conductive when the capacitor has charged;

an output conductor connected with said first rectifier for transmitting signals when this rectifier becomes conductive; and feedback means connecting said output conductor and said second rectifier for turning off the latter when an output signal has been transmitted and returning the circuit to its original state.

References Cited by the Examiner

UNITED STATES PATENTS

| | | | |
|---|---|---|---|
| 2,892,101 | 6/1959 | Bright | 307—88.5 |
| 3,124,706 | 3/1964 | Alexander | 307—88.5 |
| 3,128,396 | 4/1964 | Morgan | 307—88.5 |
| 3,153,730 | 10/1964 | Beebe | 307—88.5 |
| 3,221,182 | 10/1965 | Andersen et al. | 307—88.5 |

OTHER REFERENCES

Solid State Products Bulletin D420–02, Application and Circuit Design Notes, Dec. 1959, p. 15, Fig. 22.

G. E. Silicon Control Rectifier Manual, 2nd ed. Dec. 1961, pp. 50, 72 and 106.

ARTHUR GAUSS, *Primary Examiner.*

B. P. DAVIS, *Assistant Examiner.*